(12) United States Patent
Dobritz et al.

(10) Patent No.: US 7,834,462 B2
(45) Date of Patent: Nov. 16, 2010

(54) ELECTRIC DEVICE, STACK OF ELECTRIC DEVICES, AND METHOD OF MANUFACTURING A STACK OF ELECTRIC DEVICES

(75) Inventors: Stephan Dobritz, Dresden (DE);
Christoph Polaczyk, Dresden (DE);
Roland Irsigler, Munich (DE)

(73) Assignee: Qimonda AG, Munich (DE)

( * ) Notice: Subject to any disclaimer, the term of this patent is extended or adjusted under 35 U.S.C. 154(b) by 434 days.

(21) Appl. No.: 11/856,652

(22) Filed: Sep. 17, 2007

(65) Prior Publication Data

US 2009/0072374 A1   Mar. 19, 2009

(51) Int. Cl.
*H01L 23/48* (2006.01)
*H01L 23/02* (2006.01)

(52) U.S. Cl. ............... 257/774; 257/686; 257/E23.145
(58) Field of Classification Search ............... 257/774, 257/686, E23.145
See application file for complete search history.

(56) References Cited

U.S. PATENT DOCUMENTS

| | | | | |
|---|---|---|---|---|
| 4,074,342 A | * | 2/1978 | Honn et al. | ............... 361/779 |
| 4,807,021 A | * | 2/1989 | Okumura | ............... 257/777 |
| 4,954,875 A | * | 9/1990 | Clements | ............... 257/686 |
| 5,229,647 A | * | 7/1993 | Gnadinger | ............... 257/785 |
| 5,275,330 A | * | 1/1994 | Isaacs et al. | ............... 228/180.21 |
| 5,404,044 A | * | 4/1995 | Booth et al. | ............... 257/698 |
| 5,682,062 A | * | 10/1997 | Gaul | ............... 257/686 |
| 6,013,948 A | * | 1/2000 | Akram et al. | ............... 257/698 |
| 6,076,726 A | * | 6/2000 | Hoffmeyer et al. | ............... 228/180.22 |
| 6,809,421 B1 | * | 10/2004 | Hayasaka et al. | ............... 257/777 |
| 7,626,269 B2 | * | 12/2009 | Oliver et al. | ............... 257/774 |
| 2002/0125581 A1 | * | 9/2002 | Lin | ............... 257/778 |
| 2006/0027934 A1 | * | 2/2006 | Edelstein et al. | ............... 257/774 |
| 2006/0043599 A1 | * | 3/2006 | Akram et al. | ............... 257/774 |
| 2007/0257373 A1 | * | 11/2007 | Akram et al. | ............... 257/774 |
| 2008/0048337 A1 | * | 2/2008 | Takahashi et al. | ............... 257/774 |
| 2008/0237881 A1 | * | 10/2008 | Dambrauskas et al. | ............... 257/774 |

OTHER PUBLICATIONS

Kripesh, V., et al., "Three Dimensional Stacked modules using Silicon carrier," 2003 IEEE, 2003 Electronics Packaging Technology Conference, pp. 24-29.

* cited by examiner

*Primary Examiner*—Nitin Parekh
(74) *Attorney, Agent, or Firm*—John S. Economou

(57) ABSTRACT

According to one embodiment of the present invention, an electric device includes: a top surface and a bottom surface; a contact hole extending from the top surface through the device to the bottom surface; a conductive sealing element which seals the contact hole at or near the bottom surface; a conductive connection which is coupled to the conductive sealing element and which extends through the contact hole to the top surface; and solder material which is provided on a bottom surface of the conductive sealing element.

24 Claims, 5 Drawing Sheets

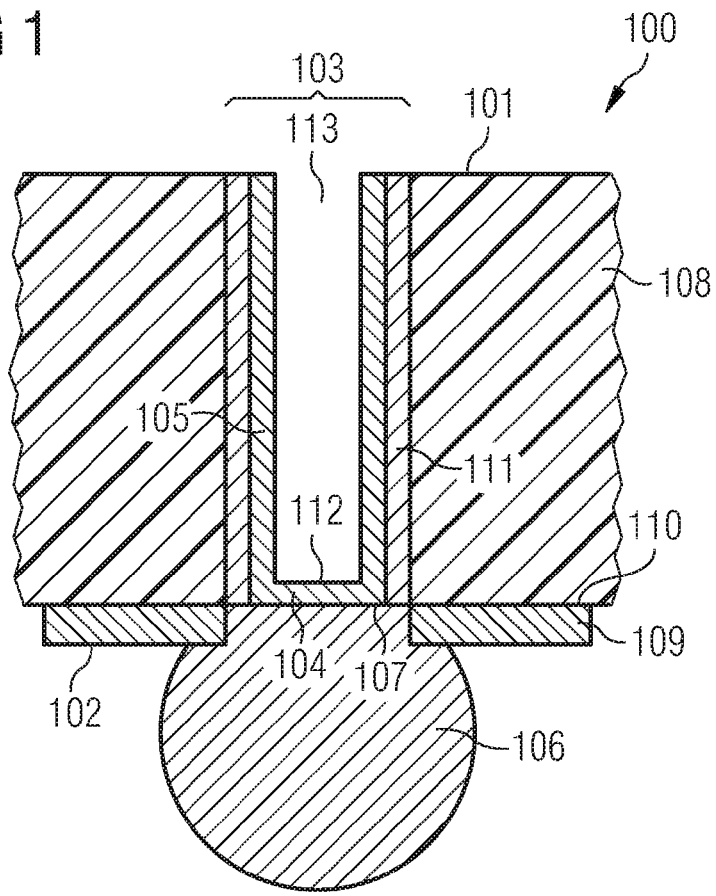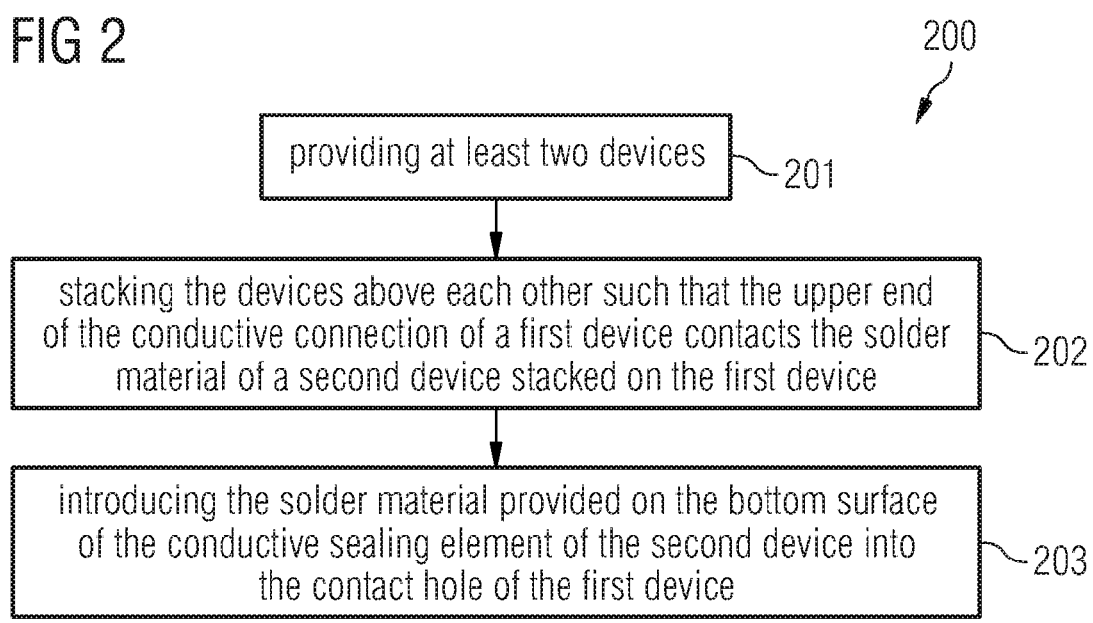

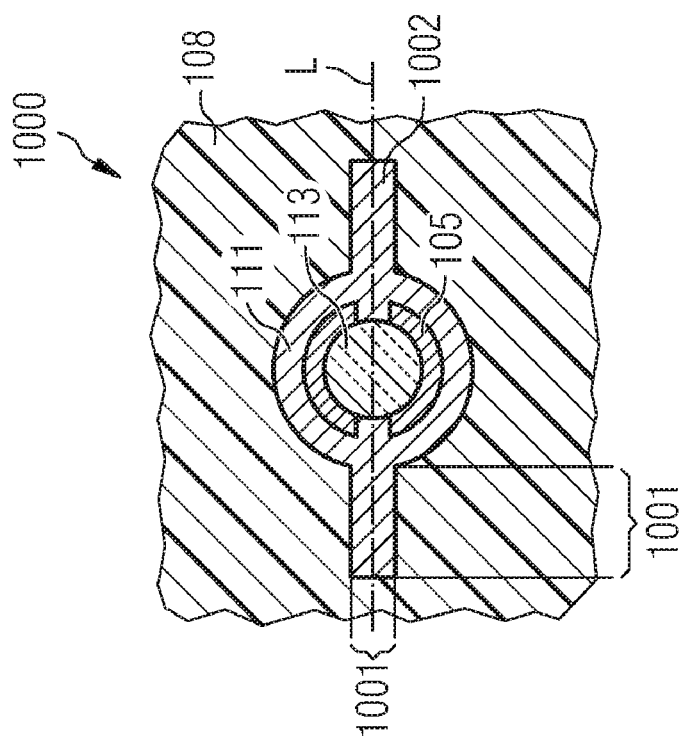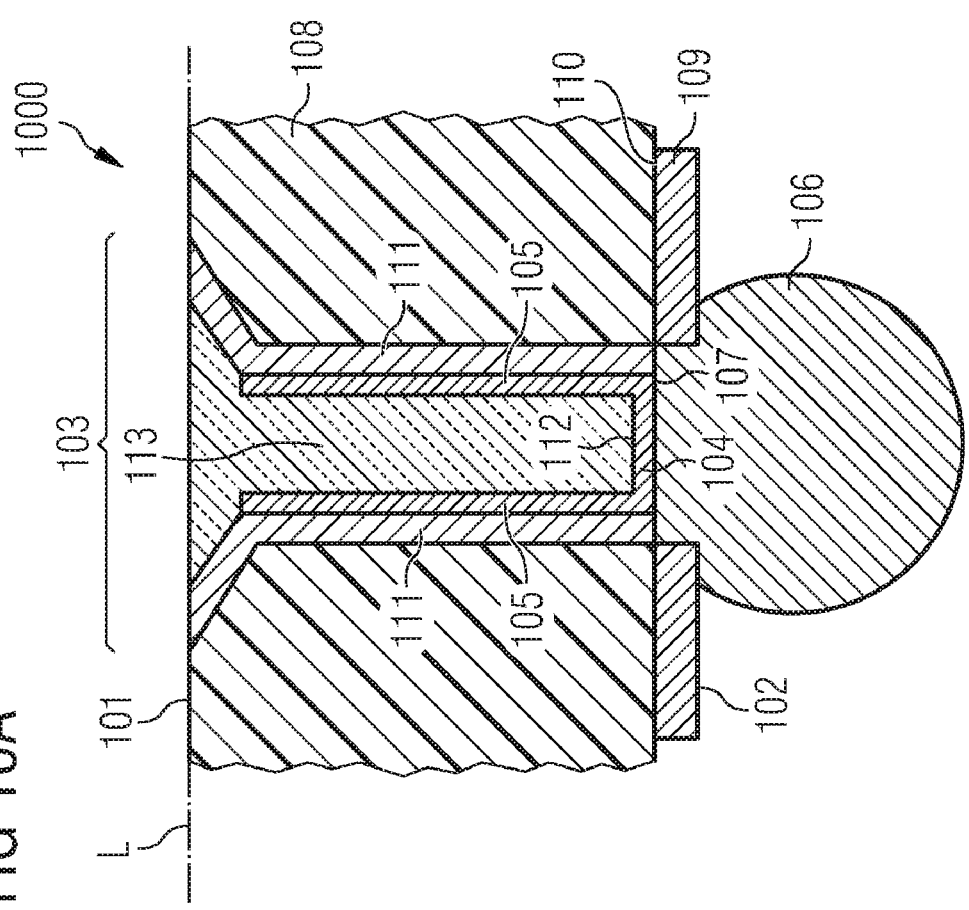

ELECTRIC DEVICE, STACK OF ELECTRIC DEVICES, AND METHOD OF MANUFACTURING A STACK OF ELECTRIC DEVICES

TECHNICAL FIELD

An embodiment of the present invention relates to an electric device, a stack of electric devices, and a method of manufacturing a stack of electric devices.

BACKGROUND

Stacks of electric devices are known. In order to test a stack, permanent electric connections (e.g. solder connections) are formed between the devices after having stacked them above each other. Then, the stack is tested as a whole by applying electric testing signals to the stack. One disadvantage is that usually the stack as a whole has to be discarded if it does not work as intended, even if the single electric devices work correctly. Since it is often not possible to re-separate the electric components from each other, the production yield may be relatively low.

SUMMARY OF THE INVENTION

The present invention provides increased production yield when manufacturing stacks of electric devices.

According to one embodiment of the present invention, an electric device is provided which includes: a top surface and a bottom surface; a contact hole extending from the top surface through the device to the bottom surface; a conductive sealing element which seals the contact hole at or near the bottom surface; a conductive connection which is coupled to the conductive sealing element and which extends through the contact hole to the top surface; and solder material which is provided on a bottom surface of the conductive sealing element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic cross-sectional view of a device according to one embodiment of the present invention;

FIG. 2 shows a flow chart of a method of manufacturing a stack of devices according to one embodiment of the present invention;

FIG. 10A shows a schematic cross-sectional view of a device according to one embodiment of the present invention; and FIG. 10B shows a schematic top view of the device shown in FIG. 10A.

DETAILED DESCRIPTION OF ILLUSTRATIVE EMBODIMENTS

Figure 3:
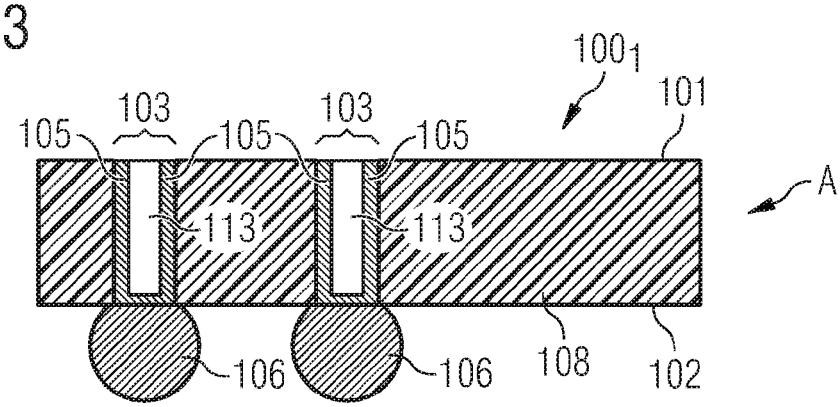
FIG. 3 shows a stack of devices according to one embodiment of the present invention.

FIG. 1 shows a cross-sectional view of a device 100 according to one embodiment of the present invention. The device 100 includes: a top surface 101 and a bottom surface 102; a contact hole 103 extending from the top surface 101 through the device 100 to the bottom surface 102; a conductive sealing element 104 which seals the contact hole 103 at or near the bottom surface 102; a conductive connection which is electrically coupled to the conductive sealing element 104 and which extends through the contact hole 103 to the top surface 101; and solder material 106 which is provided on a bottom surface 107 of the conductive sealing element 104. Although only one contact hole is shown in FIG. 1, it is to be understood that the device 100 may include an arbitrary number of contact holes 103.

In this embodiment, the solder material 106 has the shape of a ball (solder bump). However, it is to be understood that the solder material may also be shaped differently.

Here, it is assumed that the device 100 includes a substrate layer 108, for example a semiconductor substrate layer, and conductive lines 109 (or a conductive layer) being provided on a bottom surface 110 of the semiconductor substrate layer 108. The conductive lines 109 are electrically connected to the solder material 106 and may for example serve to electrically connect the solder material 106 to a semiconductor element or a semiconductor chip being formed within the semiconductor substrate layer 108.

According to one embodiment of the present invention, the conductive sealing element 104 is a conductive membrane.

Here, the sidewalls of the contact hole 103 are covered by an isolation layer 111. The conductive connection is formed by a conductive material layer 105 provided on the isolation layer 111.

Here, it is assumed that the conductive material layer covers the whole isolation layer 111. However, the invention is not restricted thereto, for example, the conductive material layer may cover the whole isolation layer 111 except of at least one continuous area extending from the top surface 101 of the device 100 to a top surface 112 of the sealing element 104. The at least one continuous area (not shown in this embodiment) may be arranged such that air is allowed to move out of the contact hole 103 via the at least one continuous area ("air channel") if solder material 106 is filled from the top surface 101 of the device 100 into the contact hole 103, i.e. if solder material is filled into the space 113 which is (at least partially) surrounded the conductive material layer 105. In this way, it can be ensured that solder material 106 which is filled into the space 113 of the contact hole 103 reaches (i.e. electrically contacts) the conductive sealing element 104 even if the space 113 is filled with air or other gaseous compounds.

According to one embodiment of the present invention, the isolation layer 111 includes or consists of silicon oxide ($SiO_2$). However, it is to be understood that the present invention is not restricted to this isolation material. Further, it has to be mentioned that the isolation layer 111 may also be omitted if the material in which the contact hole 103 is formed (i.e. in this embodiment the substrate layer 108) includes or consists of insulating material.

According to one embodiment of the present invention, the conductive material layer 105 includes or consists of copper. However, it is to be understood that the present invention is not restricted to this material.

According to one embodiment of the present invention, the solder material 106 includes or consists of lead SnPb or lead free solder SnAgCu alloys.

According to one embodiment of the present invention, the bottom surface 102 is the active surface of the device 100.

Figure 4:
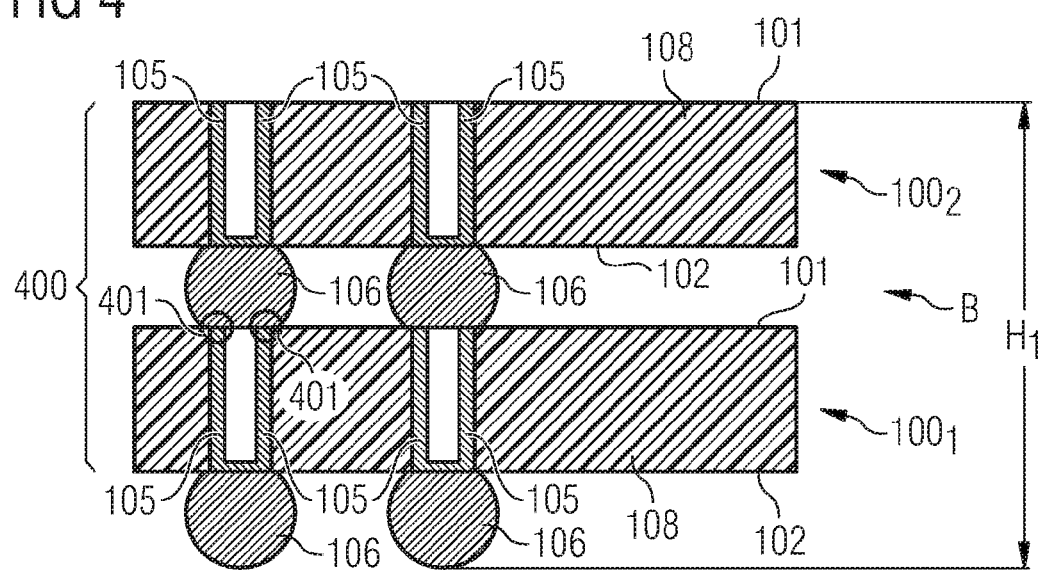
FIG. 4 shows a stack of devices according to one embodiment of the present invention.

According to one embodiment of the present invention, the upper end of the conductive material layer 105 (more generally: the upper end of the conductive connection) is shaped such that it is removably contactable from above by a solder bump, for example by a solder ball of solder material 106 as shown in FIG. 1. In this way, multiple devices 100 may be stacked above each other. For example, as shown in FIG. 4, wherein the upper end of the conductive connection 105 of a first device $100_1$ removably contacts the solder material 106 of a second device $100_2$ stacked on the first device $100_1$. The stack 400 of the first device $100_1$ and the second device $100_2$ can be tested by applying testing signals to the solder bumps 106 provided on the bottom surface of the first device $100_1$ and/or by applying testing signals to the solder bumps 106 provided at the bottom surface of the second device $100_2$ and/or by providing testing signals to the upper end of the conductive material layer 105 of the second device $100_2$. Since the connection between the solder bumps 106 connected to the second device $100_2$ and the upper end of the conductive material layer 105 of the first device $100_1$ is not a permanent connection, but a removable connection (i.e. no soldering process has been carried out which would cause a permanent connection between the solder material 106 and the conductive connection 105), the stack 400 may be separated again into the first device $100_1$ and the second device $100_2$ if the stack 400 does not work as intended.

One effect of this embodiment is that it is possible to test a stack of at least two devices 100 before these devices 100 are permanently connected by carrying out a soldering process. In this way, a better production in yield can be achieved.

FIG. 2 shows a method 200 of manufacturing stack of devices.

At 201, at least two devices are provided.

At 202, the devices are stacked above each other such that the upper end of a conductive connection of a first device contacts the solder material of a second device stacked on the first device.

At 203, the solder material provided on the bottom surface of the conductive sealing element of the second device is introduced into the contact hole of the first device.

An example of the method 200 shown in FIG. 2 will now be explained making reference to FIGS. 3 to 5.

FIG. 3 shows a processing stage A in which a first device $100_1$ has been provided. Here, it is assumed that the first device $100_1$ has the same architecture as the device 100 shown in FIG. 1. However it is to be understood that the first device $100_1$ may also have a different architecture.

FIG. 4 shows a processing stage B in which a second device $100_2$ having the same architecture as the first device $100_1$ (at least with respect to the contact holes 103) has been stacked above the first device $100_1$ such that the upper ends 401 of the conductive material layers 105 of the first device $100_1$ contact solder material 106 provided on the bottom surface 102 of the second device $100_2$. A testing procedure may be carried out in order to test if the stack 400 works as intended by applying testing signals (currents or voltages) to the solder material 106 and/or to the conductive material layers 105.

Figure 5:
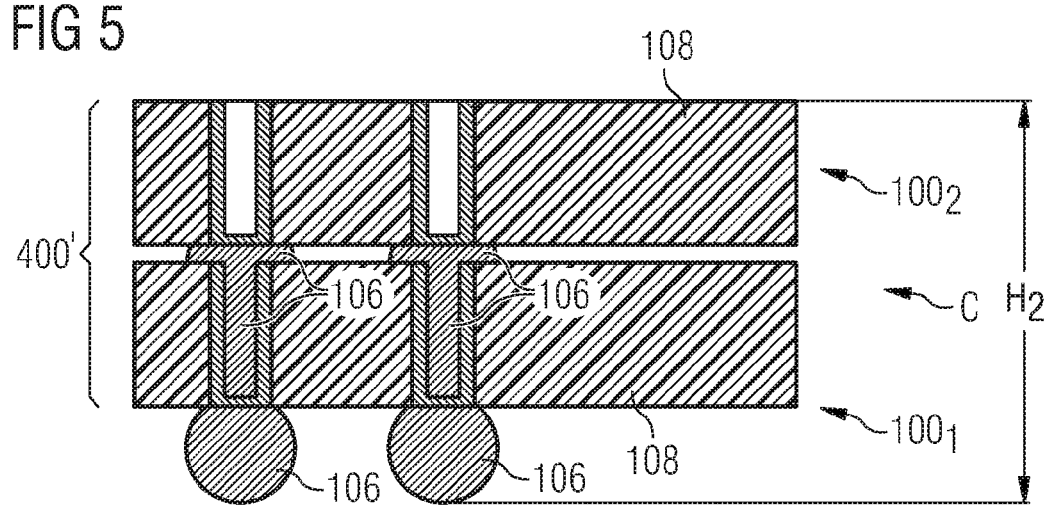
FIG. 5 shows a stack of devices according to one embodiment of the present invention.

FIG. 5 shows a processing stage C which is reached after having introduced at least a part of the solder material 106 into the contact holes 103. That is, the solder material 106 provided on the bottom surface 102 of the second device $100_2$ is introduced into the contact holes 103 formed within the first device $100_1$ (to be more exactly: the solder material 106 is introduced into the space 113 of the contact hole 103 surrounded by the conductive material layer 105).

The filling of solder material 106 into the space 113 has to be carried out such that a sufficient electrical connection is built between different devices 100 stacked above each other. However, this does not mean that the space 113 has to be completely filled with solder material 106.

According to one embodiment of the present invention, in order to introduce the solder material 106 into the contact holes 103, a heating process is carried out which heats the solder material 106 above a solder material melting temperature.

According to one embodiment of the present invention, additionally to the solder material heating process, mechanical pressure may be applied to the solder material 106 in order to introduce the solder material 106 into the contact holes 103. The mechanical pressure may for example be caused by the weight of the second device $100_2$ and/or by an external force acting on the top surface 101 of the second device $100_2$. Further, at least a part of the mechanical pressure may be generated by capillary pressure caused by the shapes of the contact holes 103.

According to one embodiment of the present invention, in order to generate or to strengthen the capillary pressure, a vacuum may be generated within the contact holes 103. More generally, a pressure gradient may be caused between the area within the contact holes 103 and the contact area outside the contact holes 103. According to one embodiment of the present invention, the pressure gradient may be generated by stacking the first device $100_1$ and the second device $100_2$ above each other within a vacuum environment, and then placing the resulting stack of first device $100_1$ and second device $100_2$ into a gaseous environment. In this way, the solder material 106 is forced to move into the contact holes 103.

According to one embodiment of the present invention, the mechanical pressure is generated, for example, due to the shape of the contact holes 103 and/or the amount and shapes of the solder bumps 106, such that the first device $100_1$ and the second device $100_2$ self-align with each other. For example, after having applied the mechanical pressure, the lateral positions of the first device $100_1$ coincide with the lateral positions of the second device $100_2$. In other words, after having finished the process of introducing solder material 106 into the contact holes 103, the movement of the solder material into the contact holes 103 causes the second device $100_2$ to change its lateral positions such that the lateral positions of the first device $100_1$ coincides with the lateral positions of the second device $100_2$.

According to one embodiment of the present invention, the solder material is introduced into the contact holes 103 such that the height of the stack 400 formed by the first device $100_1$ and the second device $100_2$ is reduced: the height $H_1$ of the stack 400 shown in FIG. 4 is larger than the height $H_2$ of the stack 400' shown in FIG. 5.

According to one embodiment of the present invention, the height reduction ($H_1$-$H_2$) is adjusted by adjusting the following ratio: (volume of the solder material 106/volume of the contact hole 103). For example, according to one embodiment of the present invention, the volume of the contact hole 103 may correspond (or be a little less than) to the volume of the solder material 106 provided on the bottom surface 102 of the conductive sealing element 104. In this way, a controlled height reduction (controlled "height collapsing") can be achieved when annealing the solder material 106. As soon as the solder material 106 becomes liquid, it has the possibility to enter the contact hole 103 (capillary effects). Nevertheless, since the solder material 106 of each device $100_1$, $100_2$ has the same shape (here: the shape of a solder ball), each each device $100_1$, $100_2$ can be tested before using the same (conventional) testing apparatus/testing method.

The processing stage C shown in FIG. 5 implies that the whole space 113 is filled with solder material 106 by the solder material introduction process. However, it may also be sufficient to fill only a part of the space 113 with solder material 106. However, it has to be insured that there is a reliable permanent electrical connection between the conductive material layer 105 of the first device $100_1$ and the solder material 106 which has been introduced into the contact holes 103 of the first device $100_1$.

Figure 6:
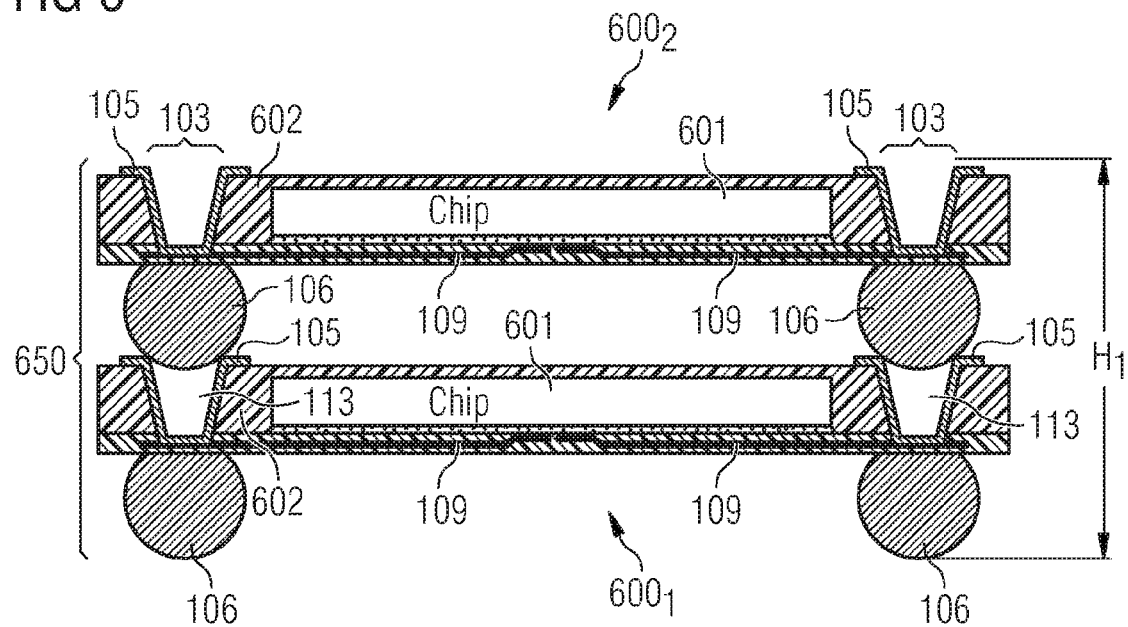
FIG. 6 shows a stack of devices according to one embodiment of the present invention.

The device 100 may for example be a chip. In this case, the substrate layer 108 may for example be a semiconductor layer or a stack of semiconductor layers. In this case, the contact holes 103 extend through the chip itself. However, as shown in FIG. 6, the embodiments of the invention are not restricted thereto. The device may also be a package 600 in which a chip 601 is embedded into a molding mass (e.g. a molding compound) 602. In this case, the contact holes 103 may also extend through the molding mass 602, and not through the chip 601 as shown in FIG. 6.

FIG. 6 shows a fabrication stage in which a second device $600_2$ is removably stacked above a first device $600_1$, thereby forming a stack 650.

Figure 7:
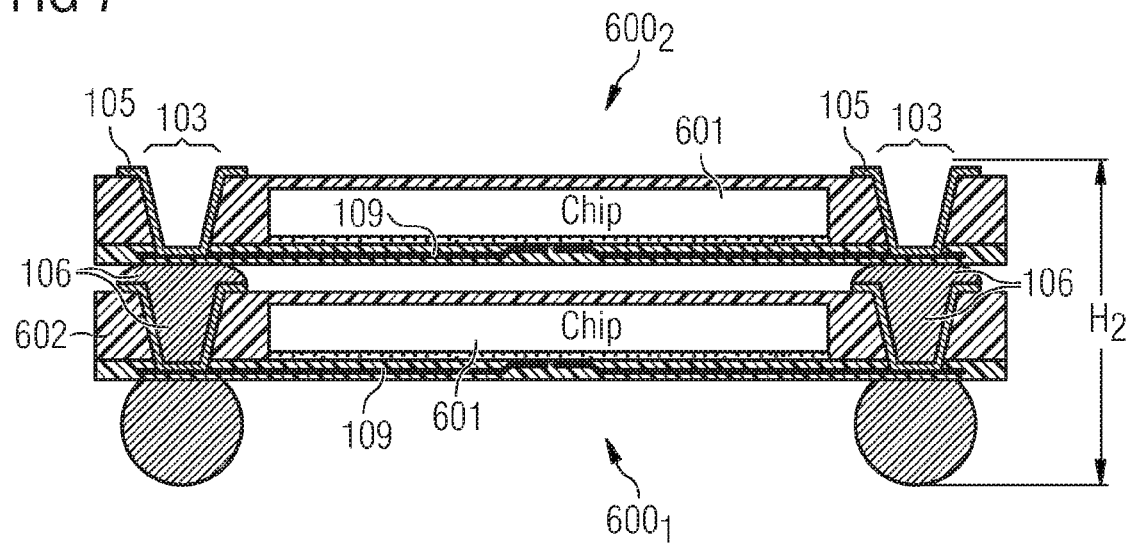
FIG. 7 shows a processing stage of manufacturing a stack of devices according to one embodiment of the present invention.

FIG. 7 shows a processing stage obtained after having introduced solder material 106 provided on the bottom surface 102 of the second device $600_2$ into the contact holes (i.e. free space 113) of the first device $600_1$.

As can be derived from FIGS. 6 and 7, the height $H_1$ of the stack 650 is reduced to the height $H_2$ when introducing the solder material 106 into the contact holes 103.

Figure 8:
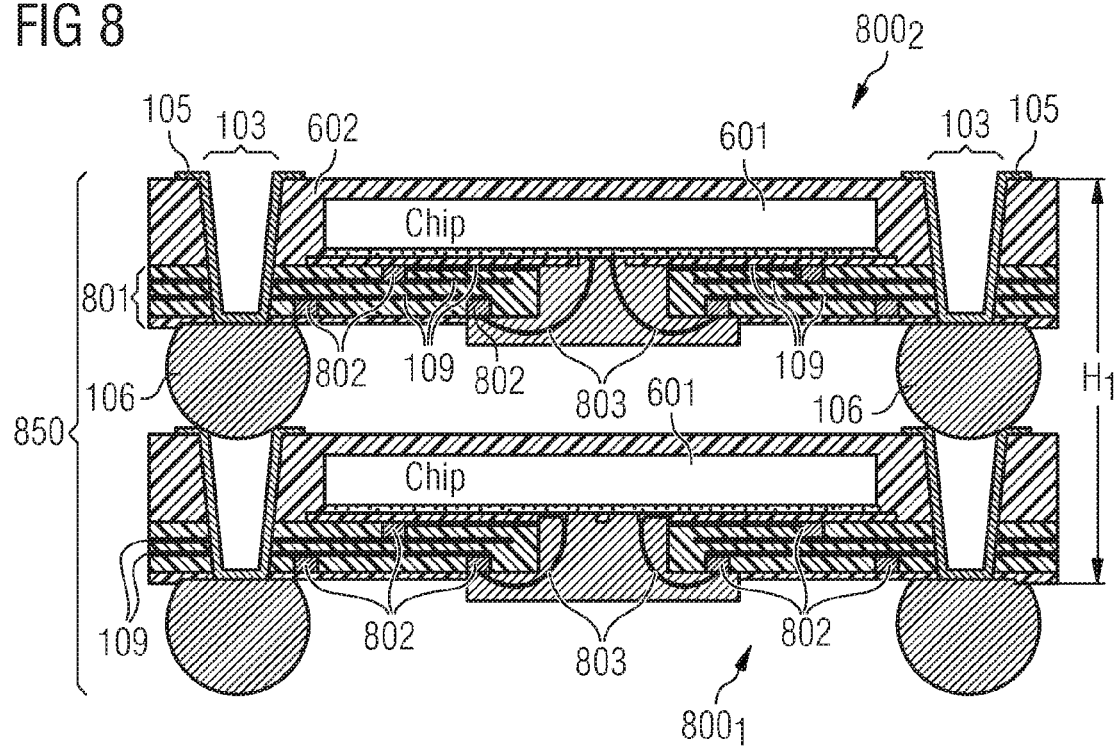
FIG. 8 shows a processing stage of manufacturing a stack of devices according to one embodiment of the present invention.
Figure 9:
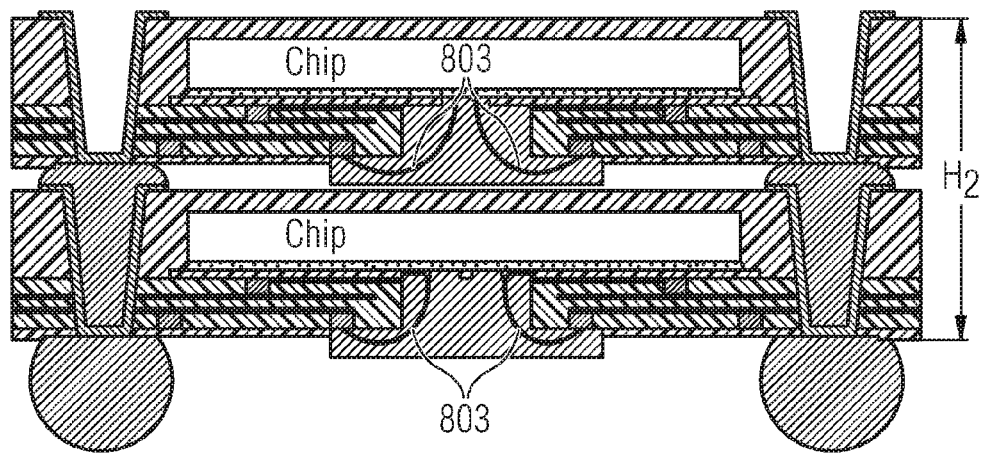
FIG. 9 shows a processing stage of manufacturing a stack of devices according to one embodiment of the present invention.

As shown in FIGS. 8 and 9, the embodiments of the present invention may also be applied to the case where the contact holes 103 extend through the molding mass 602 and a carrier substrate 801 of a package $800_1$. Conductive lines 109 may for example be connected with each other by vias 802 or with other conductive elements 803 for contacting a chip 601.

FIG. 9 shows a processing stage after having subjected the stack 850 shown in FIG. 8 to a thermal treatment process which introduces the solder material 106 into the contact holes 103, thereby generating a permanent connection between the first package $800_1$ and the second package $800_2$ and reducing the height of the stack 850.

The embodiments of the present invention may be applied in a similar way to modules.

FIGS. 10A and 10B show a device 1000. The architecture of the device 1000 is similar to the architecture of the device 100 shown in FIG. 1 except of that device 1000 has an "Air Channel" 1001. The air channel 1001 may for example have the shape of a slot which extends down to the bottom surface 110 of the semiconductor substrate layer 108, or which only extends into the upper part of the semiconductor substrate layer 108. The air channel 1001 may be partly filled with insulating material 1002 (so that an air gap remains within the insulating material) which may for example be the same isolation material as that of the isolation layer 111. According to one embodiment of the present invention, the insulating material 1002 has to be chosen such that the solder material 106 is not capable of coating the insulating material 1002 even if the solder material 106 comes into contact with the insulating material 1002. In this way, it is possible to bring air out of the contact hole via the air channel 1001 when filling solder material 106 into the contact hole 103, while at the same time the solder material does only cover the conductive material layer 105, but does not block (fill) the air channel 1001. FIG. 10A shows the cross-sectional view along the line L shown in FIG. 10B.

In the following description, further aspects of exemplary embodiments of the present invention will be explained.

Through silicon technologies enable to use new types of chip stacks for packaging. Through silicon ("Thru Silicon") technologies use vias extending through the silicon base material (bulk). The through silicon vias may for example be fabricated using the following processes: a) generating a contact hole within silicon (using for example a dry reactive ion etching (DRIE) process, a laser process, or a wet chemical etching process); b) isolating the sidewalls of the contact hole (using for example PECVD (Plasma Enhanced Chemical Vapor Deposition) oxide, a deposition of a polymer, etc.); and c) filling the contact holes with conductive material (which may for example be carried out by a sputter and plate process, by a process of printing a conductive bonding agent, by a solder material filling process, etc.).

The chips may be stacked above each other together with the through silicon vias. The connection between the chips is formed using conventional, known connection technologies (for example FC (Flip Chip)-bonding, thermo compression bonding, or SOLID (Diffusion soldering).

In order to do this, solder bumps are formed on the connection pads (for example sputter and plate, screen printing or ball drop). The solder bumps effect that a particular distance (which is dependent on the dimension of the solder bumps) is generated between the stacked chips, wherein the distance increases the overall height of the stack.

If the height of the solder bumps is very small (for example when using the connecting technology SOLID), the uniformity of the heights of the solder bumps has to be excellent in order to ensure uniform contacts between the stacked chips. In order to guarantee this, a very precise process control is necessary when forming the solder bumps or when carrying out a following planarization process (using for example chemical mechanical polishing (CNP) technique).

However, when using small solder bumps, the testing procedure of the single chips before stacking them above each other is rather difficult; further, it is difficult to carry out burn in procedures. A possible technology is the backend carrier technology which makes it possible to generate known good die. However, this technology causes additional costs.

According to one embodiment of the present invention, the contact holes are not filled with solder materials when stacking the devices (e.g. chips) above each other.

According to one embodiment of the present invention, the solder bumps are provided at the active side of the device and are used in order to test the device.

According to one embodiment of the present invention, the overall height of the stack of devices is reduced using a defined collapse process during the reflow period, therein the contact holes of the facing device (e.g. chip) are filled with the solder material of the solder bumps.

According to one embodiment of the present invention, the stack remains testable since the lowest level of solder bumps (i.e. the solder bumps connected to the bottom surface of the lowest device of the stack of devices) is remained (i.e. not filled into contact holes) when forming a permanent (solder)

connection between the devices. This may for example be achieved by preventing the lowest level of solder bumps to come into contact with any further device when heating the stack of devices (which also heats the lowest level of solder bumps.

According to one embodiment of the present invention, the provision of the solder bumps on the active side of the chip ensures that the single component can be tested using conventional testing methods and can be burned before stacking them above each other (without using a backend carrier). In this way, conventional technology can be used for the single components and for the stack of the devices during testing and burn in.

According to one embodiment of the present invention, a separate filling of the contact holes during the stacking process is no longer necessary. In this way, costs can be reduced.

According to one embodiment of the present invention, the reduction of the overall height of the stack of devices is limited by the sum of all thicknesses of the devices plus a stand of height of a solder ball (assuming that the lowest level of solder balls is maintained).

According to one embodiment of the present invention, the stack of chips does not impose new requirements on the processing SMT (Surface Mount Technology). Using a suitable technology and suitable materials, it is possible to achieve a self aliment of the stack of devices during the reflow period.

According to one embodiment of the present invention, the contact holes (for example through silicon vias) are closed at one side using a membrane, wherein the inner walls of the contact holes are covered by material which can be covered with solder material.

According to one embodiment of the present invention, the contact holes are filled with solder material after having stacked the chips or wavers (devices) above each other. The solder material volume is provided as solder bump from the neighboring device and is introduced into the contact hole for example using capillary forces during the reflow period.

According to one embodiment of the present invention, the solder bumps function as interconnect elements when electrically measuring/testing the stack of devices. Further, the solder bumps are used as filling material for the vias of neighboring chips after having stacked the devices above each other.

According to one embodiment of the present invention, the solder material is solid during the testing phase, and becomes liquid when introducing it into the contact holes.

According to one embodiment of the present invention, the term "module" can be understood as a device including at least two elements from the following group: a chip, a package, and a passive component.

According to one embodiment of the present invention, the chips may for example be random access memory chips (DRAM), FLASH-chips, any other memory chips/logic chips, power semiconductor chips, or the like.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electric device, comprising:
    a top surface and a bottom surface;
    a contact hole extending from the top surface through the device to the bottom surface;
    a conductive sealing element which seals the contact hole at or near the bottom surface, wherein the conductive sealing element is disposed only within a lower portion of the contact hole and at or above a plane coplanar with the bottom surface;
    a conductive connection which is coupled to the conductive sealing element and extends through the contact hole to the top surface, wherein the conductive sealing element and the conductive connection form an open space extending from an upper surface of the conductive sealing element to the top surface; and
    solder material which is provided on a bottom surface of the conductive sealing element, wherein the solder material physically contacts the bottom surface of the conductive sealing element.

2. The electric device according to claim 1, wherein the solder material has the shape of a solder bump.

3. The electric device according to claim 1, wherein the conductive sealing element is a conductive membrane.

4. The electric device according to claim 1, wherein sidewalls of the contact hole are at least partly covered by an isolation layer.

5. The electric device according to claim 4, wherein at least a part of the conductive connection is formed by conductive material provided on the isolation layer.

6. The electric device according to claim 1, wherein the device comprises a chip.

7. The electric device according to claim 6, wherein the contact hole extends through the chip.

8. The electric device according to claim 6, wherein the chip is embedded into a molding mass.

9. The electric device according to claim 8, wherein the contact hole extends through the molding mass.

10. The electric device according to claim 1, wherein the device comprises a package.

11. The electric device according to claim 10, wherein the contact hole extends through a substrate or a molding mass of the package.

12. The electric device according to claim 1, wherein the bottom side of the device is an active side of the device.

13. The electric device according to claim 1, wherein an upper end of the conductive connection is shaped such that it is removably contactable from above by a solder bump.

14. A stack of at least two electric devices, each device comprising:
    a top surface and a bottom surface;
    a contact hole extending from the top surface through the device to the bottom surface;
    a conductive sealing element which seals the contact hole at or near the bottom surface, wherein the conductive sealing element is disposed only within a lower portion of the contact hole and at or above a plane coplanar with the bottom surface;
    a conductive connection which is coupled to the conductive sealing element and extends through the contact hole to the top surface, wherein the conductive sealing element and the conductive connection form an open space extending from an upper surface of the conductive sealing element to the top surface;
    solder material which is provided on a bottom surface of the conductive sealing element, wherein the solder material physically contacts the bottom surface of the conductive sealing element, and wherein an upper end of the conductive connection of a first device contacts the solder material of a second device stacked on the first device.

15. The stack according to claim 14, wherein each device comprises a plurality of contact holes, wherein lateral positions of the contact holes of the first device coincide with lateral positions of solder material areas of the second device stacked on the first device.

16. The electric device of claim 14, wherein the solder material of the first device physically contacts a top surface of the conductive sealing element of the second device.

17. The electric device according to claim 14, wherein the conductive sealing element is a conductive membrane.

18. The electric device according to claim 14, wherein sidewalls of the contact hole are at least partly covered by an isolation layer.

19. The electric device according to claim 18, wherein at least a part of the conductive connection is formed by conductive material provided on the isolation layer.

20. The electric device according to claim 14, wherein the device comprises a chip.

21. The electric device according to claim 20, wherein the contact hole extends through the chip.

22. An electric device comprising a first device, the first device comprising:
   a first contact hole disposed in a first substrate having a first top surface and an opposite first bottom surface the first contact hole extending from the first to surface to the first bottom surface;
   a first isolation layer disposed on sidewalls of the first contact hole;
   a first conductive material layer disposed within the first contact hole, the first conductive material layer disposed on the first isolation layer, wherein the first conductive material layer seals an opening of the first contact hole adjacent the first bottom surface of the first substrate and wherein the first conductive material provides the contact hole with an open space through to the top surface;
   a first solder material disposed under the first contact hole adjacent the first bottom surface of the first substrate, the first solder material physically contacting the first conductive material layer; and
   wherein the first solder material physically contacts the first isolation layer.

23. The electric device according to claim 22, further comprising a second device, the second device comprising:
   a second contact hole disposed in a second substrate having a second top surface and an opposite second bottom surface, the second contact hole extending from the second top surface to the second bottom surface;
   a second isolation layer disposed on sidewalls of the second contact hole;
   a second conductive material layer having an upper surface and an opposite lower surface disposed within the second contact hole, the second conductive material layer disposed on the second isolation layer, wherein the second conductive material layer seals an opening of the second contact hole adjacent the second bottom surface of the second substrate; and
   a second solder material disposed under the second contact hole adjacent the second bottom surface of the second substrate, the second solder material physically contacting the lower surface of the second conductive material layer.

24. The electric device according to claim 23, wherein the second contact hole is filled with the first solder material, and wherein the first solder material contacts the upper surface of the second conductive material layer.

* * * * *